US011742875B1

(12) United States Patent
Kuo et al.

(10) Patent No.: US 11,742,875 B1
(45) Date of Patent: Aug. 29, 2023

(54) COMPRESSION OF FLOATING-POINT NUMBERS FOR NEURAL NETWORKS

(71) Applicant: MediaTek Inc., Hsinchu (TW)

(72) Inventors: Hsien-Kai Kuo, Hsinchu (TW); Huai-Ting Li, Hsinchu (TW); Shou-Yao Tseng, Hsinchu (TW); Po-Yu Chen, Hsinchu (TW)

(73) Assignee: MediaTek Inc., Hsinchu (TW)

( * ) Notice: Subject to any disclaimer, the term of this patent is extended or adjusted under 35 U.S.C. 154(b) by 0 days.

(21) Appl. No.: 17/724,849

(22) Filed: Apr. 20, 2022

(51) Int. Cl.
*H03M 7/00* (2006.01)
*H03M 7/30* (2006.01)
*G06F 9/50* (2006.01)
*G06N 3/04* (2023.01)
*G06N 3/08* (2023.01)
*G06N 3/063* (2023.01)

(52) U.S. Cl.
CPC ............ *H03M 7/30* (2013.01); *G06F 9/5027* (2013.01); *G06N 3/04* (2013.01); *G06N 3/063* (2013.01); *G06N 3/08* (2013.01)

(58) Field of Classification Search
CPC .......... H03M 7/30; G06F 9/5027; G06N 3/04; G06N 3/08; G06N 3/063; G06N 7/005
See application file for complete search history.

(56) References Cited

U.S. PATENT DOCUMENTS

2019/0042243 A1\* 2/2019 Tang ................... G06F 9/30025

\* cited by examiner

*Primary Examiner* — Joseph J Lauture
(74) *Attorney, Agent, or Firm* — Tong J. Lee

(57) ABSTRACT

Floating-point numbers are compressed for neural network computations. A compressor receives multiple operands, each operand having a floating-point representation of a sign bit, an exponent, and a fraction. The compressor re-orders the operands into a first sequence of consecutive sign bits, a second sequence of consecutive exponents, and a third sequence of consecutive fractions. The compressor then compresses the first sequence, the second sequence, and the third sequence to remove at least duplicate exponents. As a result, the compressor can losslessly generate a compressed data sequence.

20 Claims, 6 Drawing Sheets

COMPRESSION OF FLOATING-POINT NUMBERS FOR NEURAL NETWORKS

TECHNICAL FIELD

Embodiments of the invention relate to neural network processing, and more specifically, to the compression of floating-point numbers for neural network computations.

BACKGROUND

A deep neural network is a neural network with an input layer, an output layer, and one or more hidden layers between the input layer and the output layer. Each layer performs operations on one or more tensors. A tensor is a mathematical object that can be zero-dimensional (a.k.a. a scaler), one-dimensional (a.k.a. a vector), two-dimensional (a.k.a. a matrix), or multi-dimensional. Some of the layers apply weights to a tensor, such as in a convolution operation. Generally, a tensor produced by a neural network layer is stored in a memory and is retrieved from the memory by the next layer as input. The storing and retrieving of tensors as well as any applicable weights can use a significant amount of data bandwidth on a memory bus.

Neural network computing is computation-intensive and bandwidth-demanding. Modern computers typically use floating-point numbers with a large bit width (e.g., 16 or 32 bits) in numerical computations for high accuracy. However, the high accuracy is achieved at the cost of high power consumption and high memory bandwidth. It is a challenge to balance the need for low power consumption and low memory bandwidth while maintaining an acceptable accuracy in neural network computing.

For example, the amount of computations, measured in terms of bandwidth and multiply-and-add (MAC) operations, has grown steadily at a fast pace over the past decade. The types of neural network applications have advanced from image classification, object detection, image segmentation, estimation of depth, pose, and motion, to image quality enhancement such as super-resolution. The latest neural network applications may require up to 10 trillion MAC operations and 1 gigabit per second bandwidth. The advance in computing power generally outpaces the advance in memory bandwidth. Thus, the demand for memory bandwidth can become a bottleneck for the performance of neural network computing.

SUMMARY

In one embodiment, a method of compressing floating-point numbers is provided for neural network computations. The method comprises receiving operands, where each operand has a floating-point representation of a sign bit, an exponent, and a fraction. The method further comprises re-ordering the operands into a first sequence of consecutive sign bits, a second sequence of consecutive exponents, and a third sequence of consecutive fractions. The method further comprises compressing the first sequence, the second sequence, and the third sequence to remove at least duplicate exponents and to thereby losslessly generate a compressed data sequence.

In another embodiment, a method of decompressing a compressed data sequence is provided. The method comprises decompressing the compressed data sequence into a first sequence of N sign bits, a second sequence of N exponents, and a third sequence of N fractions, N being a positive integer. The compressed data sequence represents N operands and includes no duplicate exponent. The method further comprises re-ordering the first sequence of N sign bits, the second sequence of N exponents, and the third sequence of N fractions into a restored sequence of the N floating-point numbers representing the N operands; and sending the restored sequence of N floating-point numbers to an accelerator for the neural network computations.

In yet another embodiment, a system is provided to compress floating-point numbers. The system comprises an accelerator circuit and a compressor circuit coupled to the accelerator circuit. The compressor circuit operative to receive operands, where each operand has a floating-point representation of a sign bit, an exponent, and a fraction. The compressor circuit is further operative to re-order the operands into a first sequence of consecutive sign bits, a second sequence of consecutive exponents, and a third sequence of consecutive fractions; and compress the first sequence, the second sequence, and the third sequence to remove at least duplicate exponents. As a result, the compressor circuit can losslessly generate a compressed data sequence.

Other aspects and features will become apparent to those ordinarily skilled in the art upon review of the following description of specific embodiments in conjunction with the accompanying figures.

BRIEF DESCRIPTION OF THE DRAWINGS

The present invention is illustrated by way of example, and not by way of limitation, in the figures of the accompanying drawings in which like references indicate similar elements. It should be noted that different references to "an" or "one" embodiment in this disclosure are not necessarily to the same embodiment, and such references mean at least one. Further, when a particular feature, structure, or characteristic is described in connection with an embodiment, it is submitted that it is within the knowledge of one skilled in the art to effect such feature, structure, or characteristic in connection with other embodiments whether or not explicitly described.

DETAILED DESCRIPTION

Figure 1:
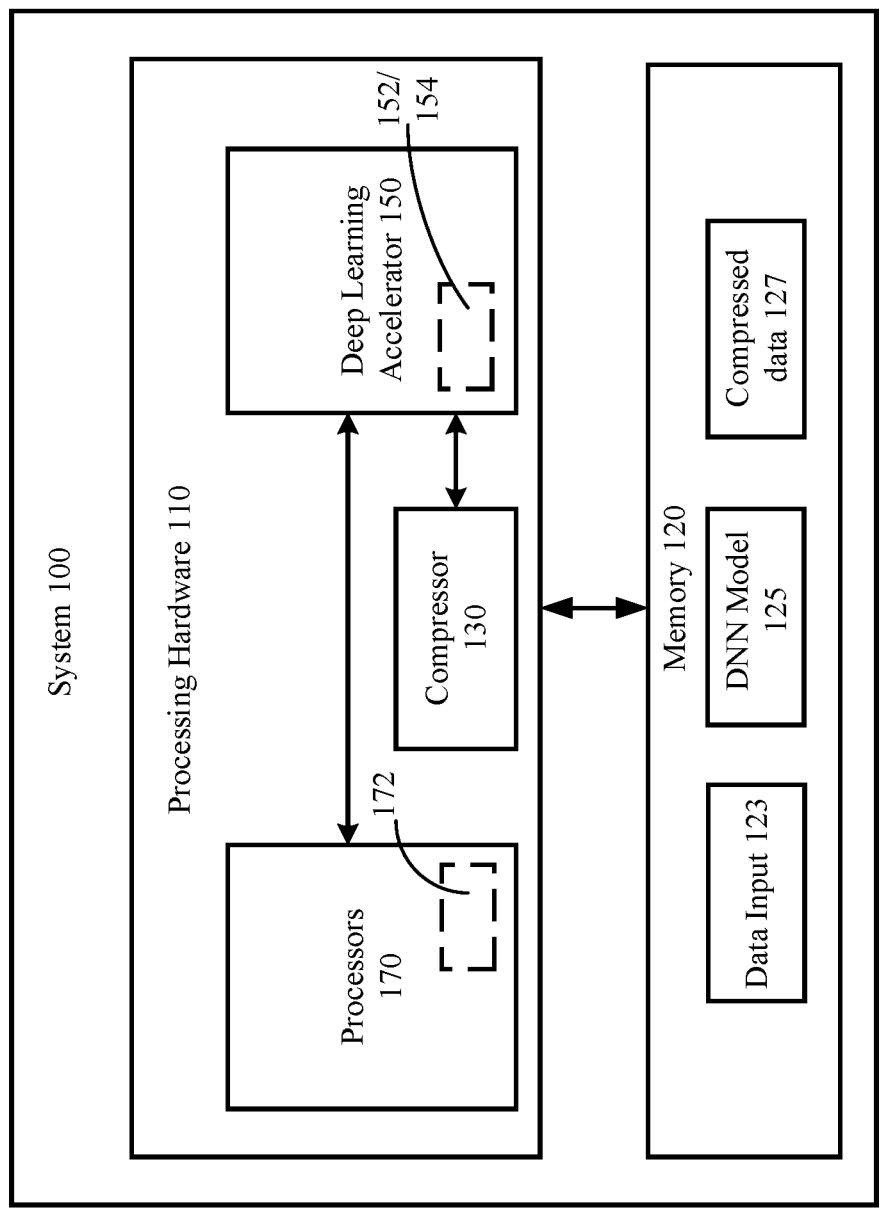
FIG. 1 is a block diagram illustrating a system operative to perform neural network operations according to one embodiment.

In the following description, numerous specific details are set forth. However, it is understood that embodiments of the invention may be practiced without these specific details. In other instances, well-known circuits, structures, and techniques have not been shown in detail in order not to obscure the understanding of this description. It will be appreciated, however, by one skilled in the art, that the invention may be practiced without such specific details. Those of ordinary skill in the art, with the included descriptions, will be able to implement appropriate functionality without undue experimentation.

Embodiments of the invention provide a mechanism for compressing floating-point numbers for neural network computing. The compression exploits redundancy in the floating-point operands of neural network operations to reduce memory bandwidth. For example, the values of an input activation (e.g., an input feature map) of a neural network layer may be distributed in a relatively small numerical range that can be represented by one or a few exponents. The compression removes the redundant bits that represent the same exponent in a highly efficient and adaptable way such that the compression and the corresponding decompression can be performed on the fly during the inference phase of neural network computing, without the underlying neural network model being re-trained.

In one embodiment, the compression and the corresponding decompression are applied to the operands of a convolutional neural network (CNN). The operands may include the input (also referred to as the input activation), output (also referred to as the output activation), and the weights of one or more CNN layers. It is understood that the compression and the corresponding decompression are applicable to neural networks that are not limited to CNNs.

In one embodiment, the floating-point compression is performed by a compressor, which compresses floating-point numbers into a compressed data sequence for storage or transmission. The compressor also decompresses the compressed data sequence to floating-point numbers for a deep learning accelerator to perform neural network computing. The compressor may be a hardware circuit, software executed by a processor, or a combination of both.

The floating-point compression disclosed herein can be specialized for workloads of neural network computing. The workloads include computations in floating-point arithmetic. Floating-point arithmetic is widely used in scientific computations and in applications where accuracy is a concern. The term "floating-point representation" as used herein refers to a number representation having a fraction (also known as "mantissa" or "coefficient") and an exponent. A floating-point representation may also include a sign bit. Examples of the floating-point representation include, but are not limited to, IEEE 754 standard formats such as 16-bit, 32-bit, 64-bit floating-point numbers, or other floating-point formats supported by some processors. The compression disclosed herein may be applied to floating-point numbers in a wide range of floating-point formats, e.g., IEEE 754 standard formats, their variants, and other floating-point formats supported by some processors. The compression is applied to both zeros and non-zeros.

The compression disclosed herein can reduce memory footprint and bandwidth, and can be easily integrated into a deep learning accelerator. The compression is lossless; therefore, there is no accuracy degradation. It is not necessary to re-train the neural networks that have already been trained. The compressed data format is adaptable to the input floating-point numbers; more specifically, the compression is adaptable to floating-point numbers with exponents of any bit width. There are no hard requirements on the bit width of the exponent of each floating-point number. It is also not necessary for the input floating-point numbers to share a pre-determined fixed number of exponents (e.g., a single exponent).

FIG. 1 is a block diagram illustrating a system 100 operative to perform neural network operations according to one embodiment. The system 100 includes processing hardware 110 that further comprises one or more processors 170 such as a central processing unit (CPU), a graphics processing unit (GPU), a digital processing unit (DSP), a field-programmable gate array (FPGA), and other general-purpose processors and/or special-purpose processors. The system 100 also includes a deep learning accelerator 150 (hereinafter referred to as the "accelerator 150") operative to perform neural network operations; e.g., tensor operations. Examples of the neural network operations include, but are not limited to: convolution, deconvolution, fully-connected operations, normalization, activation, pooling, resizing, element-wise arithmetic, concatenation, etc. In one embodiment, the processing hardware 110 may be part of a system-on-a-chip (SOC).

In one embodiment, the system 100 includes a compressor 130 coupled to the accelerator 150. The compressor 130 is operative to transform floating-point numbers into a compressed data sequence that uses fewer bits than the pre-transformed floating-point numbers.

The compressor 130 may compress the floating-point numbers generated by the accelerator 150 for memory storage or for transmission. Additionally, the compressor 130 may also decompress received or retrieved data from a compressed format to floating-point numbers for the accelerator 150 to perform neural network operations. The following description focuses on the compression for reducing memory bandwidth. However, it is understood that the compression may save transmission bandwidth when the compressed data is transmitted from the system 100 to another system or device.

In the example of FIG. 1, the compressor 130 is shown as a hardware circuit outside the processor 170 and the accelerator 150. In an alternative embodiment, a software module 172 executed by the processor 110 may perform the function of the compressor 130. In yet another embodiment, a circuit 152 within the accelerator 150 or a software module 154 executed by the accelerator 150 may perform the function of the compressor 130. The following description uses the compressor 130 as a non-limiting example to explain the compressor's operations.

The processing hardware 110 is coupled to a memory 120, which may include on-chip memory and off-chip memory devices such as dynamic random access memory (DRAM), static random access memory (SRAM), flash memory, and other non-transitory machine-readable storage media; e.g., volatile or non-volatile memory devices. The term "on-chip" is used herein to mean on the SOC where the processing hardware 110 is located, and the term "off-chip" is used herein to mean off the SOC. To simplify the illustration, the memory 120 is represented as one block; however, it is understood that the memory 120 may represent a hierarchy of memory components such as cache memory, local memory to the accelerator 150, system memory, solid-state or magnetic storage devices, etc. The processing hardware 110 executes instructions stored in the memory 120 to perform operating system functionalities and run user applications. The memory 120 may store a DNN model 125, which can be represented by a computational graph including multiple layers, such as an input layer, an output layer, and one or more hidden layers in between. An example of the DNN model 125 is a multi-layer CNN. The DNN model 125 may have been trained to have weights associated with one or more of the layers.

In one embodiment, the system 100 may receive and store the input data 123 in the memory 120. The input data 123 may be an image, a video, a speech, etc. The memory 120 may store instructions which, when executed by the accelerator 150, cause the accelerator 150 to perform neural network computing on the input data 123 according to the DNN model 125. The memory 120 may also store compressed data 127 such as the output of neural network computing.

Figures 2A, 2B:
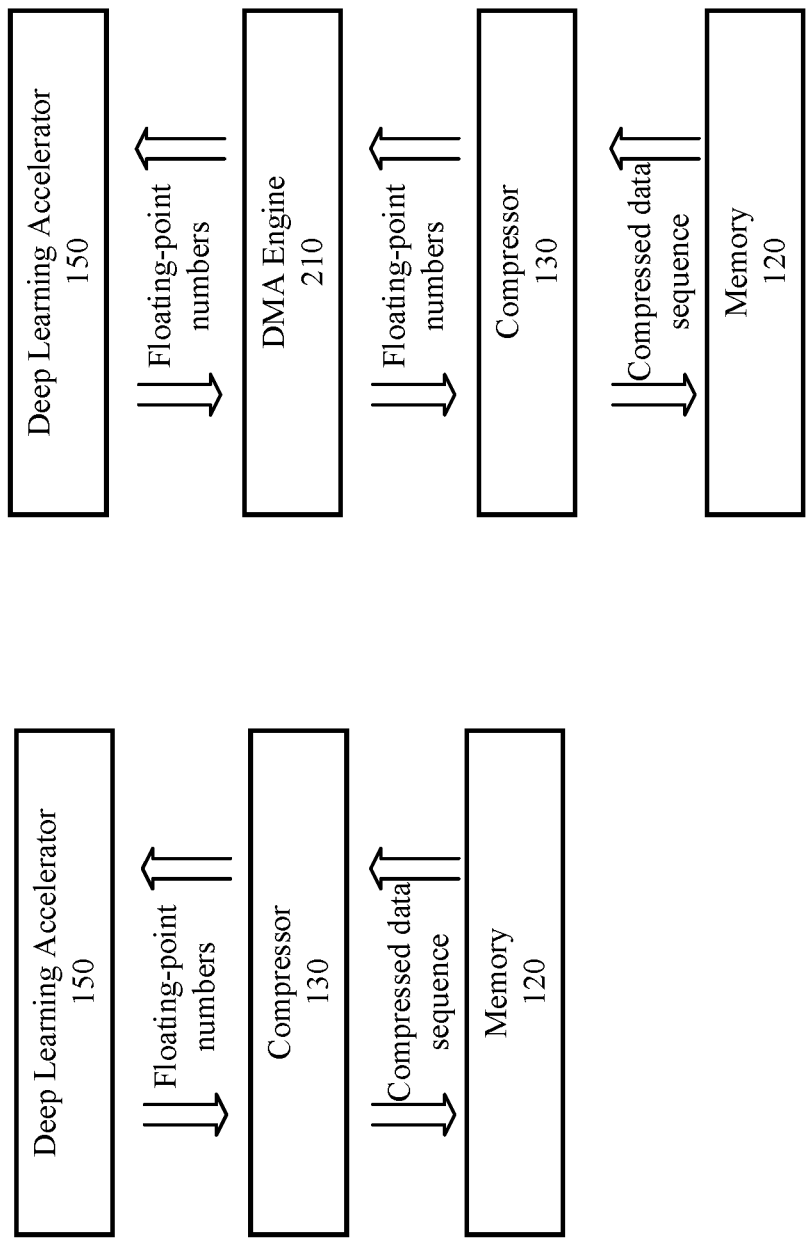
FIG. 2A and FIG. 2B illustrate interactions between an accelerator and memory according to two alternative embodiments.

FIG. 2A and FIG. 2B illustrate interactions between the accelerator 150 and the memory 120 according to two alternative embodiments. FIG. 2A shows that the accelerator 150 may perform neural network operations using the compressed data stored in the memory 120. For example, the accelerator 150 may retrieve from the memory 120 compressed data such as input activation and weights for a first CNN layer. The compressor 130 decompresses the retrieved data into floating-point numbers for the accelerator 150. The accelerator 150 may store the output of the first CNN layer in the memory 120. The compressor 130 compresses the accelerator's output from floating-point numbers into a compressed format before memory storage. In FIG. 2B, a direct memory access (DMA) engine 210 may store and retrieve compressed data from the memory 120 for the accelerator 150.

The floating-point compression performed by the compressor 130 includes an unpacking stage, a shuffling stage, and a data compression stage, in that order. The unpacking stage and the shuffling stage may be collectively referred to as a re-ordering stage. The decompression includes a data decompression stage, an un-shuffling stage, and a packing stage, in that order. The un-shuffling stage and the packing stage may also be collectively referred to as a re-ordering stage. The compressor 130 transforms data in each of the stages as described below with reference to FIG. 3.

Figure 3:
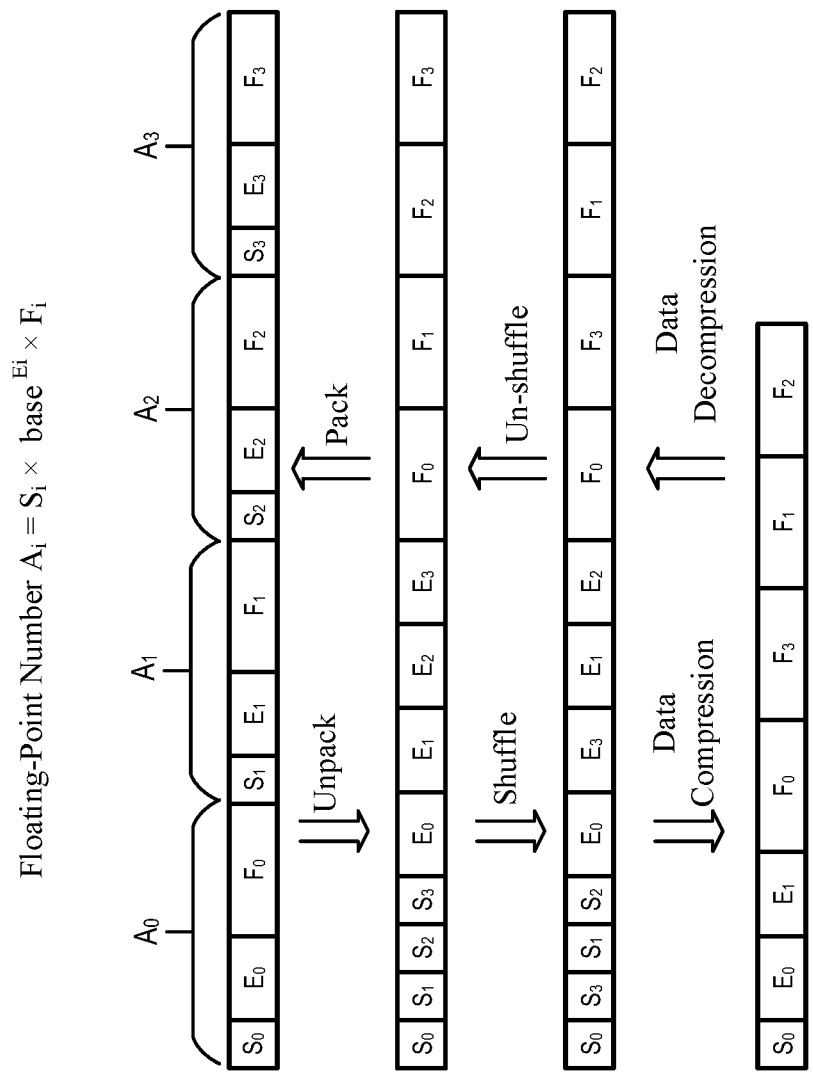
FIG. 3 is a diagram illustrating the transformation operations performed by a compressor according to one embodiment.

FIG. 3 is a diagram illustrating the transformation operations performed by a compressor according to one embodiment. Referring also to FIG. 1, the compressor 130 may compress the floating-point operands of a CNN layer by a series of unpacking, shuffling, and compressing operations. Each floating-point number is represented by a 3-element field (S, E, F) in floating-point representation, where S is the sign bit, E is the exponent, and F is the fraction. The bit width of each of E and F can be determined by the neural network application to be executed on the accelerator 150. The compressor 130 does not impose requirements on the bit width of each of E and F fields. The compressor 130 can operate on E and F of any bit widths.

In the unpacking stage, the compressor 130 extracts the fields of floating-point numbers to consolidate each of the S, E, and F fields and to thereby generate a first sequence of sign bits, a second sequence of exponents, and a third sequence of fractions. The shuffling operation identifies those floating-point operands with the same exponent, and re-order the operands such that they are adjacent to one another. Then the compressor 130 compresses the unpacked and re-ordered operands to at least remove duplicate exponents from the sequence. A duplicate exponent is a redundant exponent; therefore, it can be removed without loss of information. Additionally, the data compression operation may also remove any duplicate sign bits and/or duplicate fractions from the sequence. The compressor 130 may use any known lossless data compression algorithm (e.g., run-length encoding, LZ compression, Huffman encoding, etc.) to reduce the number of bits in the representation of the compressed data sequence.

In the example of FIG. 3, the sequence of floating-point operands includes A0, A1, A2, and A3. All four operands have the same sign bit (S0). A0 has the same exponent (E0) as A3, and A1 has the same exponent (E1) as A2. The compressor 130 unpacks the four operands by forming a first sequence of four consecutive sign bits, a second sequence of four consecutive exponents, and a third sequence of four consecutive fractions. The three sequences can be arranged in any order. The compressor 130 shuffles the operands by moving E0 next to E3, and E1 next to E2. The shuffling operation also moves the corresponding sign bits and fractions; i.e., S0 is next to S3, S1 is next to S2, F0 is next to F3, and F1 is next to F2. The compressor 130 then removes at least the duplicate exponents (e.g., E2 and E3). The compressor 130 may also remove the duplicate sign bits (e.g., S1, S2, and S3). A data compression algorithm may be applied to the three sequences to generate a compressed data sequence. The exponent sequence may be compressed separately from the fraction sequence. Alternatively, the three sequences may be compressed together as one sequence. The compressor 130 generates metadata that records parameters of the shuffling; e.g., the positions or distances of movement of the re-ordered operands to track the position of each operand in the shuffled sequence. The metadata may also include parameters of the data compression algorithm; e.g., the compression rate. The compressed data sequence and the metadata may be stored in the memory 120. In one scenario where the compressed data sequence exceeds the capacity of the on-chip memory of the accelerator 150, the compressed data sequence may be stored in an off-chip memory such as a DRAM.

The compressor 130 can also perform decompression to transform a compressed data sequence into the original form of floating-point numbers (e.g., A0, A1, A2, and A3 in the example). According to the metadata, the compressor 130 decompresses a compressed data sequence by reversing the aforementioned compression operations. In one embodiment, the compressor 130 may decompress a compressed data sequence by a series of data decompression, un-shuffling, and packing operations. In the data decompression stage, the compressor 130 decompresses a compressed data sequence based on the data compression algorithm previously used in the data compression. The decompression restores the previously-removed duplicate exponents and any other duplicate or redundant data elements. In the un-shuffling stage, the compressor 130 restores, according to the metadata, the original order of the floating-point numbers represented in three sequences of sign bits, exponents, and fractions. In the packing stage, the compressor 130 combines the three fields of each floating-point number to output the original floating-point number sequence (e.g., A0, A1, A2, and A3 in the example).

A neural network layer may have a large number of floating-point operands; e.g., several gigabytes of data. Thus, the compressor 130 may process a batch of N operands at a time; e.g., N may be 256 or 512. The example of FIG. 3 uses N=4 for illustrative purposes.

In an alternative embodiment, the compressor 130 may identify those operands that share the same exponent and remove duplicate exponents without the shuffling operations. In yet another embodiment, the compressor 130 may identify those operands that share the same exponent and remove duplicate exponents without the unpacking and the shuffling operations.

Figure 4:
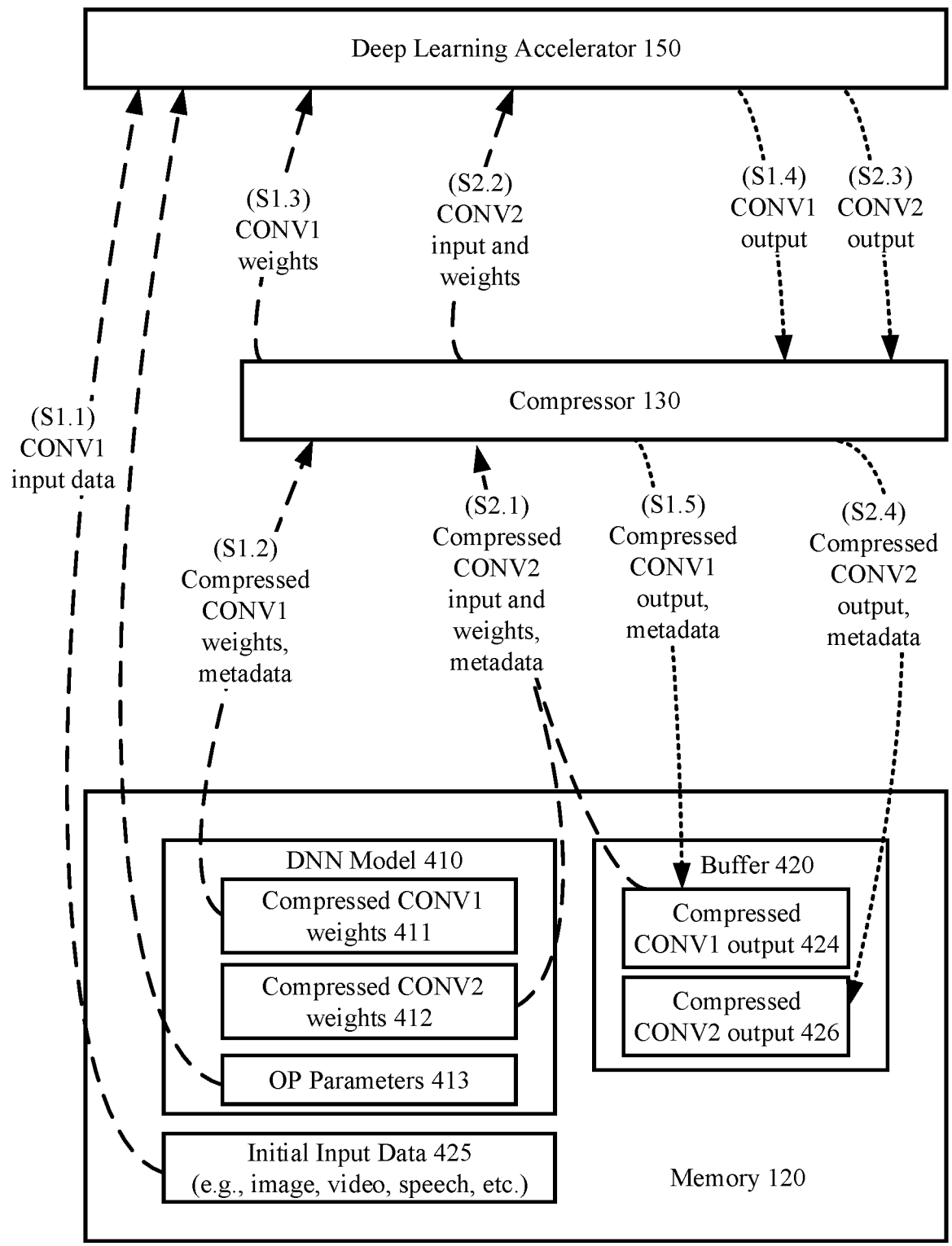
FIG. 4 is a diagram illustrating data movements in CNN operations according to one embodiment.

FIG. 4 is a diagram illustrating data movements in CNN operations according to one embodiment. The operations of two CNN layers are shown for illustrative purposes.

Referring also to FIG. 1, the memory 120 stores a DNN model 410, initial input data 425, and a buffer 420. The accelerator 150 starts the operations of a first CNN layer (i.e., CONV1) by retrieving the initial input data 425 and operation parameters 413 for CONV1 from the memory 120

(Step S1.1). The accelerator 150 also retrieves, or requests the retrieval of, compressed CONV1 weights 411 from the memory 120 (Step S1.2). In this embodiment, the initial input data 425 (e.g., an image, a video, a speech, etc.) has not been compressed, and the CONV1 weights 411 (as well as CONV2 weights 412) have been compressed. In alternative embodiments, any of the initial input data 425 and the weights 411, 412 may be compressed or uncompressed. The compressor 130 decompresses the compressed CONV1 weights 411 and passes the CONV1 weights to the accelerator 150 (Step S1.3). The decompression may be performed in the three transformation stages (i.e., data decompression, un-shuffling, and packing) described before with reference to FIG. 3. The accelerator 150 performs the first CNN layer operations and generates CONV1 output (Step S1.4). The CONV1 output is the input activation of the second CNN layer. The compressor 130 compresses the CONV1 output and generates metadata associated with the compressed CONV1 output 424 (Step S1.5). The compression may be performed in the three transformation stages (i.e., unpacking, shuffling, and data compression) described before with reference to FIG. 3. The compressed CONV1 output 424 and the metadata are then stored in the buffer 420 of the memory 120. The compressed CONV1 output 424 is the compressed CONV2 input.

The accelerator 150 starts the operations of a second CNN layer (i.e., CONV2) by retrieving or causing the retrieval of the compressed CONV2 input, metadata, the compressed CONV2 weights 412, and operation parameters 413 for CONV2 from the memory 120 (Step S2.1). The compressor 130 decompresses the compressed CONV2 input according to the metadata, decompresses the CONV2 weights 412, and passes the decompressed output to the accelerator 150 (Step S2.2). The accelerator 150 performs the second CNN layer operations and generates CONV2 output (Step S2.3). The compressor 130 compresses the CONV2 output and generates metadata associated with the compressed CONV2 output 426 (Step S2.4). The compressed CONV2 output 426 and the metadata are then stored in the buffer 420.

The example of FIG. 4 shows that the data traffic moving in and out of the memory 120 mostly contains compressed data. More specifically, the accelerator's output activation from one neural network layer, which is also the accelerator's input activation for the next neural network layer, is compressed. Thus, in a deep neural network that contains multiple layers, the memory bandwidth can be greatly reduced as the activation data between layers are transported on the memory bus in a compressed form.

Figure 5:
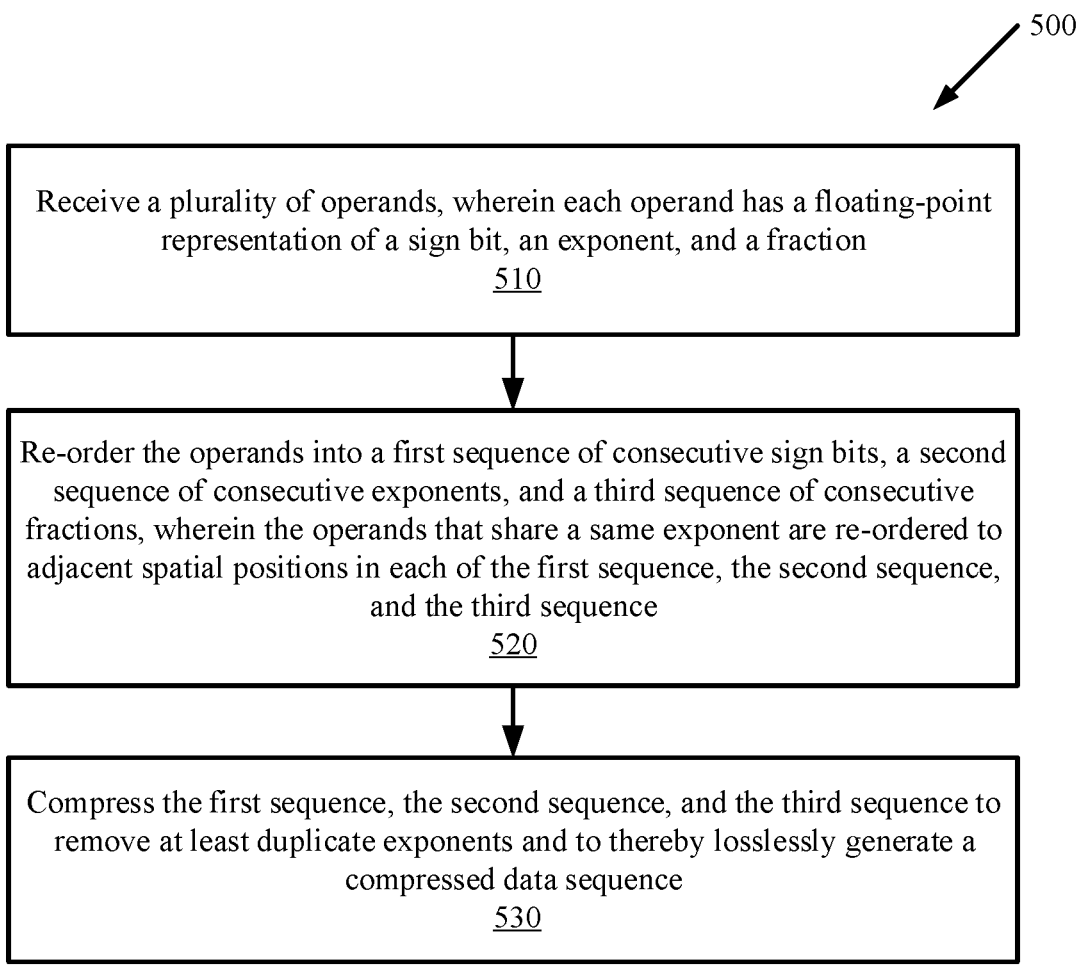
FIG. 5 is a flow diagram illustrating a method of compressing floating-point numbers according to one embodiment.

FIG. 5 is a flow diagram illustrating a method 500 of compressing floating-point numbers according to one embodiment. The method 500 may be performed by the embodiments of FIGS. 1, 2A, and/or 2B.

The method 500 begins at step 510 when a system (e.g., the system 100 of FIG. 1) receives a plurality of operands, wherein each operand has a floating-point representation of a sign bit, an exponent, and a fraction. At step 520, a compressor in the system re-orders the operands into a first sequence of consecutive sign bits, a second sequence of consecutive exponents, and a third sequence of consecutive fractions. At step 530, the compressor compresses the first sequence, the second sequence, and the third sequence to remove at least duplicate exponents and to thereby losslessly generate a compressed data sequence.

In one embodiment, the operands that share a same exponent are re-ordered to adjacent spatial positions in each of the first sequence, the second sequence, and the third sequence. In one embodiment, the re-ordering and the compressing are performed in multiple batches of N operands, N being a non-negative integer. The compressor generates meta-data indicating parameters used in the re-ordering and the compressing. The first sequence may be compressed to remove duplicate sign bits.

In one embodiment, the operands may include weights of a CNN layer. The operands may include activation output from an accelerator executing a CNN layer. The compressor may store the compressed data sequence in a memory, and may retrieve the compressed data sequence for decompression for the accelerator to execute a subsequent layer of the CNN. The compression of the floating-point numbers is adaptable to the exponent of any bit width.

Figure 6:
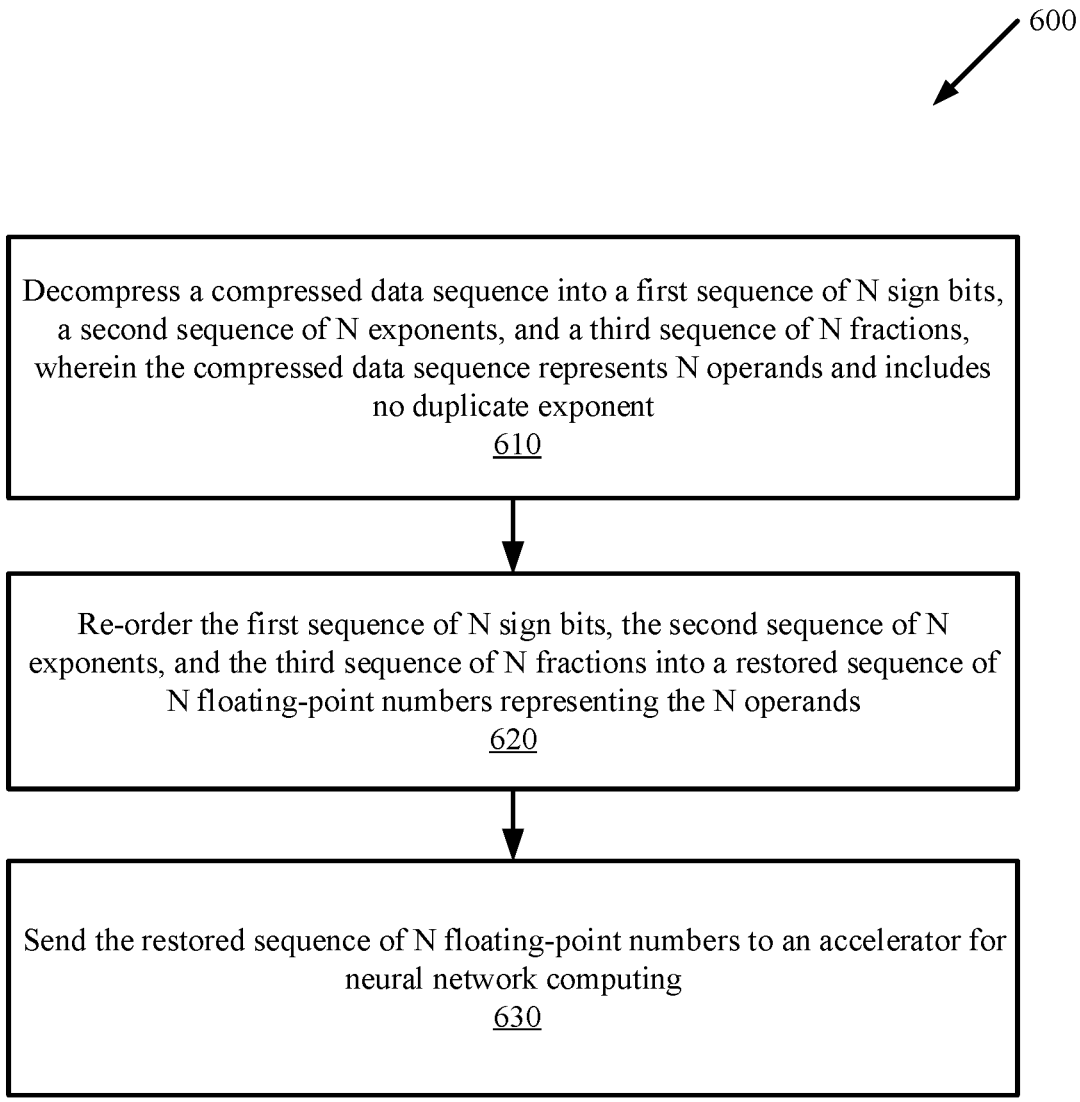
FIG. 6 is a flow diagram illustrating a method of decompressing data into floating-point numbers according to one embodiment.

FIG. 6 is a flow diagram illustrating a method 600 of decompressing data into floating-point numbers according to one embodiment. The method 600 may be performed by the embodiments of FIGS. 1, 2A, and/or 2B.

The method 600 begins at step 610 when a compressor in a system (e.g., the system 100 of FIG. 1) decompresses a compressed data sequence into a first sequence of N sign bits, a second sequence of N exponents, and a third sequence of N fractions (N being a positive integer). The compressed data sequence represents N operands and includes no duplicate exponent. At step 620, the compressor re-orders the first sequence of N sign bits, the second sequence of N exponents, and the third sequence of N fractions into a restored sequence of N floating-point numbers representing the N operands. At step 630, the restored sequence of N floating-point numbers are sent to an accelerator (e.g., the accelerator 150 of FIG. 1) for neural network computing. In one embodiment, after the decompression at step 610, the operands that share a same exponent are located at adjacent spatial positions in each of the first sequence, the second sequence, and the third sequence.

The operations of the flow diagrams of FIGS. 5 and 6 have been described with reference to the exemplary embodiments of FIGS. 1, 2A, and 2B. However, it should be understood that the operations of the flow diagrams of FIGS. 5 and 6 can be performed by embodiments of the invention other than the embodiments of FIGS. 1, 2A, and 2B, and the embodiments of FIGS. 1, 2A, and 2B can perform operations different than those discussed with reference to the flow diagrams. While the flow diagrams of FIGS. 5 and 6 show a particular order of operations performed by certain embodiments of the invention, it should be understood that such order is exemplary (e.g., alternative embodiments may perform the operations in a different order, combine certain operations, overlap certain operations, etc.).

Various functional components or blocks have been described herein. As will be appreciated by persons skilled in the art, the functional blocks will preferably be implemented through circuits (either dedicated circuits, or general-purpose circuits, which operate under the control of one or more processors and coded instructions), which will typically comprise transistors that are configured in such a way as to control the operation of the circuitry in accordance with the functions and operations described herein.

While the invention has been described in terms of several embodiments, those skilled in the art will recognize that the invention is not limited to the embodiments described, and can be practiced with modification and alteration within the spirit and scope of the appended claims. The description is thus to be regarded as illustrative instead of limiting.

What is claimed is:

1. A method of compressing floating-point numbers for neural network computations, comprising:

receiving a plurality of operands, wherein each operand has a floating-point representation of a sign bit, an exponent, and a fraction;

re-ordering the operands into a first sequence of consecutive sign bits, a second sequence of consecutive exponents, and a third sequence of consecutive fractions; and compressing the first sequence, the second sequence, and the third sequence to remove at least duplicate exponents and to thereby losslessly generate a compressed data sequence.

2. The method of claim 1, wherein the operands that share a same exponent are re-ordered to adjacent spatial positions in each of the first sequence, the second sequence, and the third sequence.

3. The method of claim 1, further comprising:
re-ordering and compressing in multiple batches of N operands, N being a non-negative integer.

4. The method of claim 1, wherein the compressing further comprises:
compressing the first sequence to remove duplicate sign bits.

5. The method of claim 1, further comprising:
generating meta-data indicating parameters used in the re-ordering and the compressing.

6. The method of claim 1, wherein the operands include weights of a layer of a convolutional neural network.

7. The method of claim 1, wherein the operands include activation output from an accelerator executing a layer of a convolutional neural network.

8. The method of claim 7, further comprising:
storing the compressed data sequence in a memory; and
retrieving the compressed data sequence for decompression for the accelerator to execute a subsequent layer of the convolutional neural network.

9. The method of claim 1, wherein the compressing of the floating-point numbers is adaptable to the exponent of any bit width.

10. A method of decompressing a compressed data sequence, comprising:
decompressing the compressed data sequence into a first sequence of N sign bits, a second sequence of N exponents, and a third sequence of N fractions, N being a positive integer, wherein the compressed data sequence represents N operands and includes no duplicate exponent;
re-ordering the first sequence of N sign bits, the second sequence of N exponents, and the third sequence of N fractions into a restored sequence of the N floating-point numbers representing the N operands; and
sending the restored sequence of N floating-point numbers to an accelerator for the neural network computations.

11. The method of claim 10, wherein after the decompressing, the operands that share a same exponent are located at adjacent spatial positions in each of the first sequence, the second sequence, and the third sequence.

12. A system operative to compress floating-point numbers, comprising:
an accelerator circuit; and
a compressor circuit coupled to the accelerator circuit, the compressor circuit operative to:
receive a plurality of operands, wherein each operand has a floating-point representation of a sign bit, an exponent, and a fraction;
re-order the operands into a first sequence of consecutive sign bits, a second sequence of consecutive exponents, and a third sequence of consecutive fractions; and
compress the first sequence, the second sequence, and the third sequence to remove at least duplicate exponents and to thereby losslessly generate a compressed data sequence.

13. The system of claim 12, wherein the operands that share a same exponent are re-ordered to adjacent spatial positions in each of the first sequence, the second sequence, and the third sequence.

14. The system of claim 12, wherein the compressor circuit is further operative to:
re-order and compress in multiple batches of N operands, N being a non-negative integer.

15. The system of claim 12, wherein the compressor circuit is further operative to:
compress the first sequence to remove duplicate sign bits.

16. The system of claim 12, wherein the compressor circuit is further operative to:
generate meta-data that indicates parameters used in the re-ordering and the compressing.

17. The system of claim 12, wherein the operands include weights of a layer of a convolutional neural network.

18. The system of claim 12, wherein the operands include activation output from the accelerator circuit executing a layer of a convolutional neural network.

19. The system of claim 18, further comprising:
a memory, wherein the compressor circuit is further operative to:
store the compressed data sequence in the memory; and
retrieve the compressed data sequence for decompression for the accelerator circuit to execute a subsequent layer of the convolutional neural network.

20. The system of claim 12, wherein the compressor circuit is further operative to:
decompress the compressed data sequence to losslessly restore the operands in a floating-point format.

* * * * *